US006822817B2

(12) United States Patent
Chung et al.

(10) Patent No.: US 6,822,817 B2
(45) Date of Patent: Nov. 23, 2004

(54) PREAMPLIFIER CIRCUIT SUITABLE FOR USE IN MAGNETIC STORAGE DEVICES

(75) Inventors: Paul Wingshing Chung, San Jose, CA (US); John Thomas Contreras, San Jose, CA (US); Stephen Alan Jove, Hollister, CA (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 10/284,811

(22) Filed: Oct. 31, 2002

(65) Prior Publication Data

US 2004/0085667 A1 May 6, 2004

(51) Int. Cl.⁷ .............................................. G11B 5/09
(52) U.S. Cl. .......................... 360/46; 360/67; 327/52; 330/252
(58) Field of Search .............................. 360/46, 67, 66; 327/51, 52, 54, 55; 330/252, 255, 259, 262, 270, 282

(56) References Cited

U.S. PATENT DOCUMENTS

| 4,191,977 | A | 3/1980 | Lewkowicz |
| 4,706,138 | A | 11/1987 | Jove et al. |
| 4,786,993 | A | 11/1988 | Jove et al. |
| 5,389,832 | A | 2/1995 | Boerstler et al. |
| 5,717,547 | A | 2/1998 | Young |
| 5,793,551 | A | 8/1998 | Ngo et al. |
| 5,825,571 | A | 10/1998 | Sandusky et al. |
| 6,046,875 | A | 4/2000 | Siniscalchi et al. |
| 6,226,136 | B1 | 5/2001 | Chern |
| 6,262,628 | B1 * | 7/2001 | Shinomiya .................... 330/69 |
| 6,265,905 | B1 | 7/2001 | Jove et al. |
| 6,674,595 | B1 * | 1/2004 | Chiou et al. .................. 360/67 |
| 2001/0036028 | A1 | 11/2001 | Putnam et al. |
| 2003/0231419 | A1 * | 12/2003 | Umeyama et al. ............ 360/66 |

OTHER PUBLICATIONS

V.N. Kahwaty and R. E. Weinstein, Preamplifier for Magnetoresistive Heads Using Series Voltage Bias, IBM Technical Disclosure Bulletin, vol. 31, No. 8, Jan. 1989.

* cited by examiner

Primary Examiner—Alan T. Faber
(74) Attorney, Agent, or Firm—John J. Oskorep, Esq.

(57) ABSTRACT

Bi-Variant Coupled Pair (BVCP) circuits suitable for use in channel front-end low noise preamplifiers of magnetic storage devices are described. In a magnetic storage device, a BVCP circuit provides a DC bias voltage for a read transducer, low-noise amplification performance, and relatively small AC coupling capacitor values for reducing the cost of an integrated circuit (IC) in which the BVCP circuit may be embodied. The BVCP circuit also has a controllable input impedance for matching a transmission line impedance for high data rate applications.

38 Claims, 5 Drawing Sheets

PREAMPLIFIER CIRCUIT SUITABLE FOR USE IN MAGNETIC STORAGE DEVICES

BACKGROUND OF THE INVENTION

1. Field of the Invention

The present invention relates generally to preamplifier circuits, and more particularly to low-noise preamplifier circuitry of an integrated circuit (IC) which is suitable for use with a read sensor in a magnetic storage device.

2. Description of the Related Art

A magnetic storage device typically includes a magnetic head which has a read sensor, a magnetic disk, a read/write integrated circuit (R/W IC), and a suspension interconnect coupled between the read sensor and the R/W IC. The read sensor, which may be a magnetoresistive (MR) sensor or a giant magnetoresistive (GMR) sensor, is used for reading data from the disk. The read sensor is coupled to an input of the R/W IC, which generally includes read signal processing circuitry. The read signal processing circuitry biases the read sensor with a fixed direct current (DC) bias voltage or current, amplifies signals read from the disk, and may provide further processing of the amplified signals. The read sensor is coupled to the R/W IC through the suspension interconnect, which is primarily carried along an actuator arm. The suspension interconnect generally includes electrical conductors and, in one particular implementation, it includes copper alloy traces etched upon an insulator which extend along the actuator arm.

In general, the resistance of such read sensors change in response to changing magnetic flux orientations on the magnetic disk. Changes in resistance of the read sensor translate into a varying analog electrical signal which is received and processed by the R/W IC. The processed analog signals are ultimately converted into digital data. In this general fashion, the magnetic storage device is able to read data from the disk at relatively high data rates (e.g. greater than 300–400 megabits per second (Mbs)). Unfortunately, without appropriate preamplifier circuitry in the read circuitry, too much interference may be picked up while reading and amplifying the signals from the read sensor to the read circuitry. Such interference ultimately affects the accuracy and/or the speed in which the signals can be read from the disk. In addition, the R/W IC may include large internal capacitors to provide for the DC bias and an AC coupled amplifier input. Large internal capacitors, however, consume a large area in the R/W IC and increase its cost. Furthermore, transmission line effects of the suspension interconnect during high data rate operation may undesirably influence the spectral content of the read signal.

FIGS. 1–2 are schematic diagrams of prior art preamplifier circuits which may be used in read signal processing circuitry of a R/W IC, but have one or more of the above-stated deficiencies. In particular, FIG. 1 is a schematic diagram of a preamplifier circuit 100 of the prior art which may be referred to as a common-emitter preamplifier. Preamplifier circuit 100 includes transistors 102 and 104 (denoted Q1 and Q2, respectively), fixed current sources 106 and 108, resistors 114 and 116, and a capacitor 110. A differential input of preamplifier circuit 100 (at $V_2$ and $V_1$) is provided at the bases of transistors 102 and 104, whereas a differential output of preamplifier circuit 100 (at $V_{out}$) is provided at the collectors of transistors 102 and 104. The collector of transistor 102 is coupled to a voltage source 118 through resistor 114, whereas the collector of transistor 104 is coupled to voltage source 118 through resistor 116. A first end of current source 106 is coupled to the emitter of transistor 102 and a second end of current source 106 is coupled to a voltage source 120. Similarly, a first end of current source 108 is coupled to the emitter of transistor 104 and a second end of current source 104 is coupled to voltage source 120. Capacitor 110 is shunted across the emitters of transistors 102 and 104.

The primary disadvantage of preamplifier circuit 100 of FIG. 1 is that, in magnetic storage applications, the size of capacitor 110 must be relatively large (e.g. on the order of 5 nanofarads (nF)). Unfortunately, such a large capacitor consumes a significant amount of real estate in an IC and thereby increases the IC's cost. In one specific design, it was noted that the capacitor required 40–50% of the space in the IC.

FIG. 2 is a schematic diagram of another preamplifier circuit 200 of the prior art, which may be referred to as a quasi-current sensing amplifier. Preamplifier circuit 200 is shown coupled to a read sensor 202 through a transmission line 206. Read sensor 202 is illustrated as having an internal resistance 204 (denoted $R_{GMR}$), and transmission line 206 is illustrated as having an impedance $Z_0$). Preamplifier circuit 200 includes transistors 208 and 210 (denoted Q1 and Q2, respectively), fixed current sources 212 and 214, variable current sources 224 and 226, resistors 216 and 218, a capacitor 228, and an operational transconductance amplifier (OTA) 230. Transistors 208 and 210 have bases which are biased at a bias voltage $V_{Bias}$, collectors which are coupled to a voltage source 220 (e.g. supply voltage $V_{cc}$) through resistors 216 and 218, respectively, and emitters which are coupled to first ends of fixed current sources 212 and 214, respectively. The second ends of current sources 212 and 214 are coupled to a voltage source 222.

First ends of variable current sources 224 and 226 are coupled to voltage source 220 directly, and second ends of controlled current sources 224 and 226 are coupled to emitters of transistors 208 and 210, respectively. The differential input of preamplifier circuit 200 is provided at the emitters of transistors 208 and 210, whereas a differential output of preamplifier circuit 200 is provided at the collectors of transistors 208 and 210. The input of OTA 230 is coupled to the differential output of preamplifier circuit 200, whereas the output of OTA 230 is coupled to both adjustable current sources 224 and 226 to control the current thereof. Capacitor 228 is coupled between the output of OTA 230 and voltage source 220.

Preamplifier circuit 200 has a controllable input impedance which can provide an impedance match with transmission line 206. The input impedance of preamplifier circuit 200 may be adjusted by adjusting the value of $r_e$ of transistors 208 and 210. Unfortunately, this controlled input impedance feature has a significant impact on the noise performance of preamplifier circuit 200. The mathematical expression for the input referred spot noise voltage source for preamplifier circuit 200 is $$v^2{}_{ni}=4kT(2r_b+5r_e).$$

where k=Boltzmann's constant, T=temperature (Kelvin), $r_b$=(transistor transconductance)$^{-1}$, and $r_e$=transistor base resistance.

Accordingly, what is needed is an improved preamplifier circuit, especially one that has the ability to provide low-noise performance, relatively small AC coupling capacitor values to reduce the cost of the IC, and input impedance control to match the impedance of a transmission line for high data rate applications.

SUMMARY OF THE INVENTION

What is invented and described herein are circuits which may be referred to as Bi-Variant Coupled Pair (BVCP) circuits. BVCP circuits are suitable for use in channel front-end low-noise preamplifiers of magnetic storage devices as well as other applications. In a magnetic storage device, the channel front-end includes a read transducer, a read/write (R/W) integrated circuit (IC) which includes the BVCP circuit, and a suspension interconnect which connects the read transducer and the R/W IC. The read transducer may be a magnetoresistive (MR) or giant magnetoresistive (GMR) read sensor. In this particular application, the BVCP circuit has the ability to provide (1) a fixed direct current (DC) bias voltage for the varying resistance of the read transducer; (2) low-noise performance; and (3) a relatively small alternating current (AC) coupling capacitance for reducing the cost of the R/W IC.

The BVCP circuit may also have a controllable input impedance, which is suitable for matching the impedance of a transmission line (e.g. a suspension interconnect) for high data rate applications. Impedance matching allows the system in which the R/W IC is used to increase or maximize its high frequency bandwidth. Two different controllable input impedance schemes for BVCP circuits are described herein, namely, (1) direct broadband feedback receiver termination (DBT) and (2) isolated broadband feedback receiver termination (IBT). In DBT, the BVCP circuit uses the read signal path as a feedback loop, thereby making the preamplifier's input impedance equal to the characteristic impedance of the transmission line. In IBT, the BVCP circuit uses an alternate isolated signal path to control the impedance.

The preamplifier circuit of the present invention includes first, second, third, and fourth transistors; first and second current sources; first and second capacitive elements; and first, second, third, and fourth resistive elements. A differential input of the preamplifier circuit, which includes a first input node and a second input node, may be coupled to a read sensor of a magnetic head. The first transistor has a base coupled to the first input node of the differential input; a collector coupled to a voltage source through the first resistive element; and an emitter coupled to the first current source. The second transistor has a collector coupled to the voltage source through the second resistive element; an emitter coupled to the first current source and to a first end of the first capacitive element; and a base coupled to a biasing voltage through the third resistive element and to a first end of the second capacitive element. The third transistor has a base coupled to the second input node of the differential input; a collector coupled to the voltage source through the second resistive element; and an emitter coupled to the second current source. The fourth transistor has an emitter coupled to the second current source and to a second end of the second capacitive element; a base coupled to the biasing voltage through the fourth resistive element and to a second end of the first capacitive element; and a collector coupled to the voltage source through the first resistive element.

A differential output of the preamplifier circuit has a first output node coupled to the collector of the first transistor and a second output node coupled to the collector of the third transistor. The preamplifier circuit may also include an operational transconductance amplifier (OTA), which may be of the differential-common-mode (DC-OTA) type. The OTA has first and second inputs coupled to the first and the second output nodes, and first and second outputs coupled to the first and the second input nodes. To set the preamplifier's input impedance, a first buffer circuit and feedback resistor may be coupled between the first output node and the first input node, and a second buffer circuit and feedback resistor may be coupled between the second output node and the second input node. The input impedance of the preamplifier circuit may be set to match the impedance of a transmission line which is coupled at the differential input.

DETAILED DESCRIPTION OF THE PREFERRED EMBODIMENTS

What is invented and described herein are circuits which may be referred to as Bi-Variant Coupled Pair (BVCP) circuits. BVCP circuits are suitable for use in channel front-end low-noise preamplifiers of magnetic storage devices as well as other applications. In magnetic storage devices, the channel front-end includes a read transducer, a read/write (R/W) integrated circuit (IC) which includes the BVCP circuit, and a suspension interconnect which connects the read transducer and the R/W IC. The read transducer may be a magnetoresistive (MR) or giant magnetoresistive (GMR) read sensor. In this particular application, the BVCP circuit has the ability to provide for a fixed direct current (DC) bias voltage for the varying resistance of the read transducer, low-noise performance, and relatively small alternating current (AC) coupling capacitors for reducing the R/W IC cost. The BVCP circuit may also be configured with a controllable input impedance to match the impedance of a transmission line (e.g. the suspension interconnect) in high data rate applications.

Figure 1:
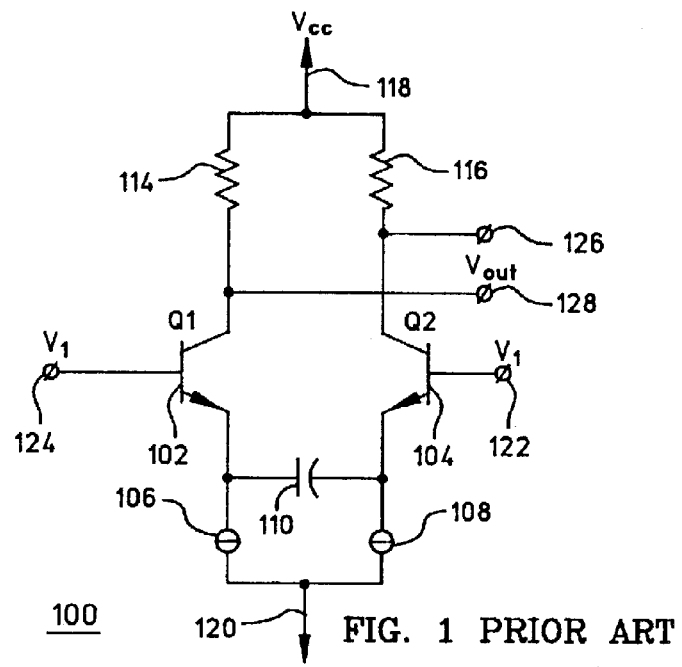
FIG. 1 is schematic diagram of a preamplifier circuit of the prior art which may be referred to as a common-emitter preamplifier.
Figure 2:
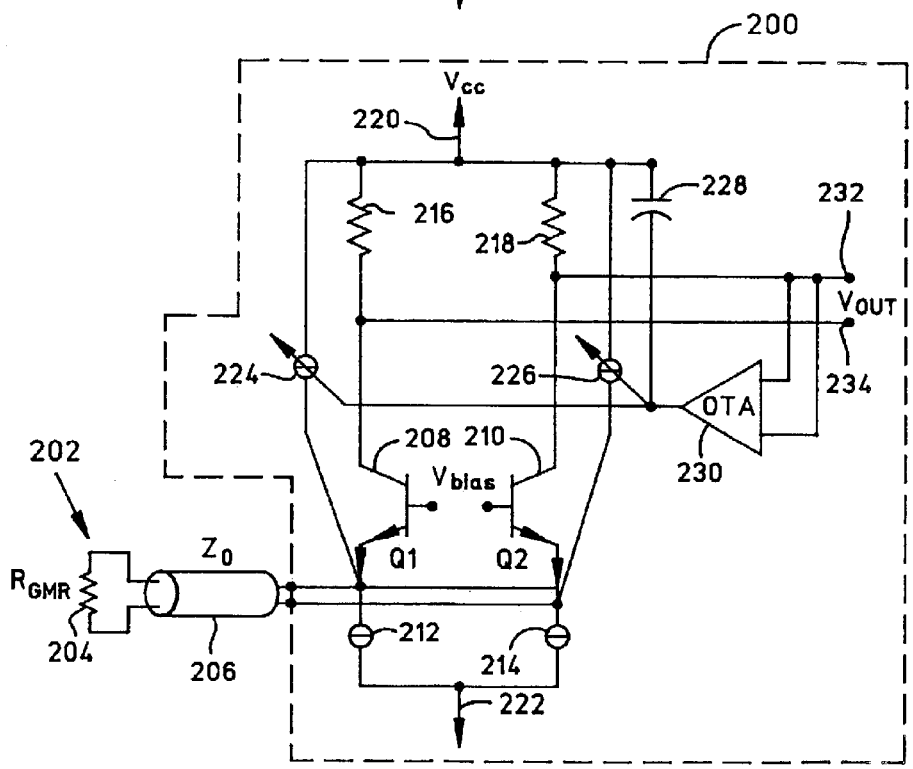
FIG. 2 is a schematic diagram of another preamplifier circuit of the prior art which may be referred to as a quasi-current sensing amplifier having a controllable input impedance.
Figure 3:
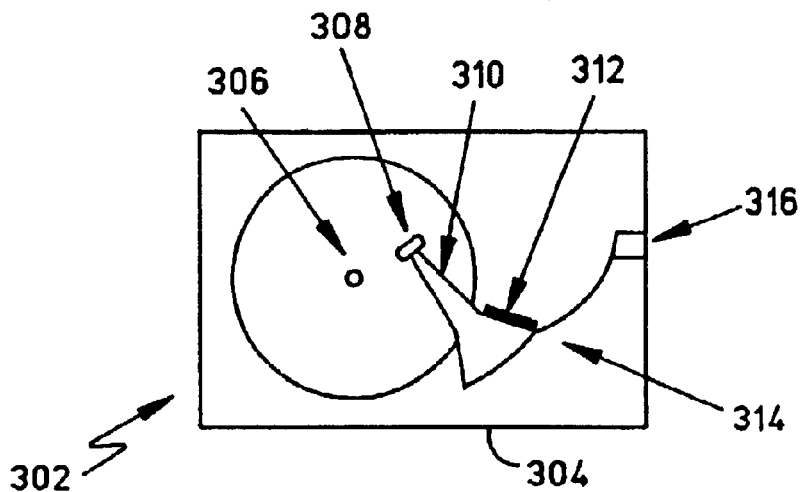
FIG. 3 is a simplified top down view of a magnetic storage device, which is one application in which the present invention may be employed.
Figure 4:
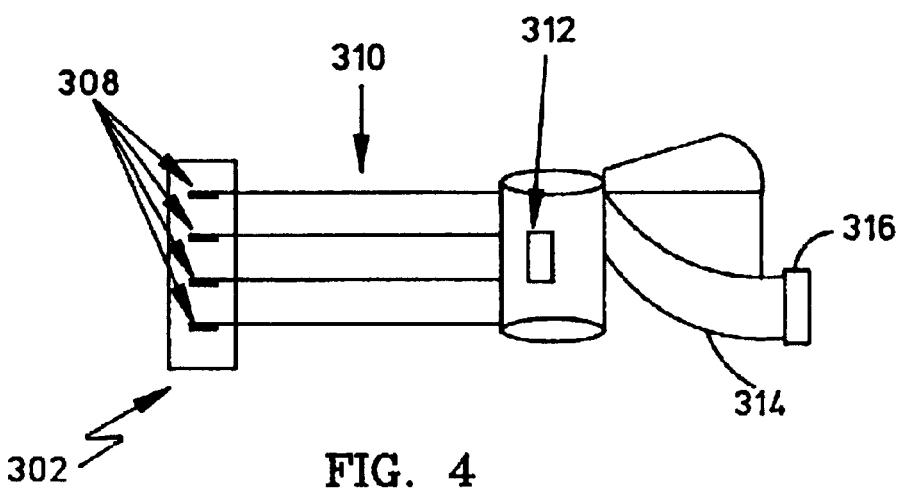
FIG. 4 is a simplified side view of the magnetic storage device of FIG. 3.

FIG. 3 is a simplified top down view of a magnetic storage device 302 (e.g. a disk drive), which is one application in which the present invention may be employed. FIG. 4 provides a side view of the same device 302. Magnetic storage device 302 includes a read sensor 308 of a magnetic head, a magnetic disk 306 (one type of data storage medium), a read/write integrated circuit (R/W IC) 312, a suspension interconnect 310, a flex cable 314, and an enclosure connector 316, all of which are contained and carried within a housing enclosure 304. As illustrated more clearly in FIG. 4, magnetic storage device 302 may actually include multiple read sensors 308 and associated magnetic disks 306 and suspension interconnects 310.

Read sensor 308 is used for reading magnetic data signals from disk 306. Read sensor 308 may be any suitable transducer, such as a magnetoresistive (MR) sensor or a giant magnetoresistive (GMR) sensor in this particular application. Read sensor 308 is coupled to an input of R/W IC 312, which generally includes read signal processing circuitry. The read signal processing circuitry includes circuitry which biases read sensor 308 with a fixed direct current (DC) bias voltage, amplifies signals read from disk 306, and provides for further processing the amplified signals. Read sensor 308 is coupled to R/W IC 312 through suspension interconnect 310, which is primarily carried along an actuator arm of device 302. Suspension interconnect 310 generally includes electrical conductors and, in one particular implementation, suspension interconnect 310 includes copper alloy traces etched upon an insulator which extend along the actuator arm for a distance of between about 2.5–5.0 centimeters (cm) (as dictated by the size of disk 306). A first end of flex cable 314 is coupled to R/W IC 312, and a second end of flex cable 314 is coupled to enclosure connector 304.

In general, the resistance of read sensor 308 changes in response to changing magnetic flux orientations on disk 306. The changes in resistance of read sensor 308 translate into a varying analog electrical signal which is received and processed by R/W IC 312. Processed analog signals from R/W IC 312 are carried through flex cable 314 and out through enclosure connector 316. The processed analog signals are ultimately converted into digital data. In this general fashion, magnetic storage device 302 is able to read data from disk 306 at a relatively high data rate. High data rates are deemed to be data rates that exceed 300–400 megabits per second (Mps).

Without appropriate circuitry in the read signal processing circuitry of R/W IC 312, too much noise would be added during the reading and amplification of the signals from read sensor 308. Such noise would ultimately affect the accuracy and/or the speed in which the data can be read from disk 306. Furthermore, R/W IC 312 could include large internal capacitors in its read circuitry to assist in the reading and processing of signals, but these capacitors would consume a large area in the IC and increase its cost. Finally, transmission line effects of suspension interconnect 310 during high data rate operation could undesirably influence the spectral content of the read signal, if nothing is done to avoid it.

Figure 5:
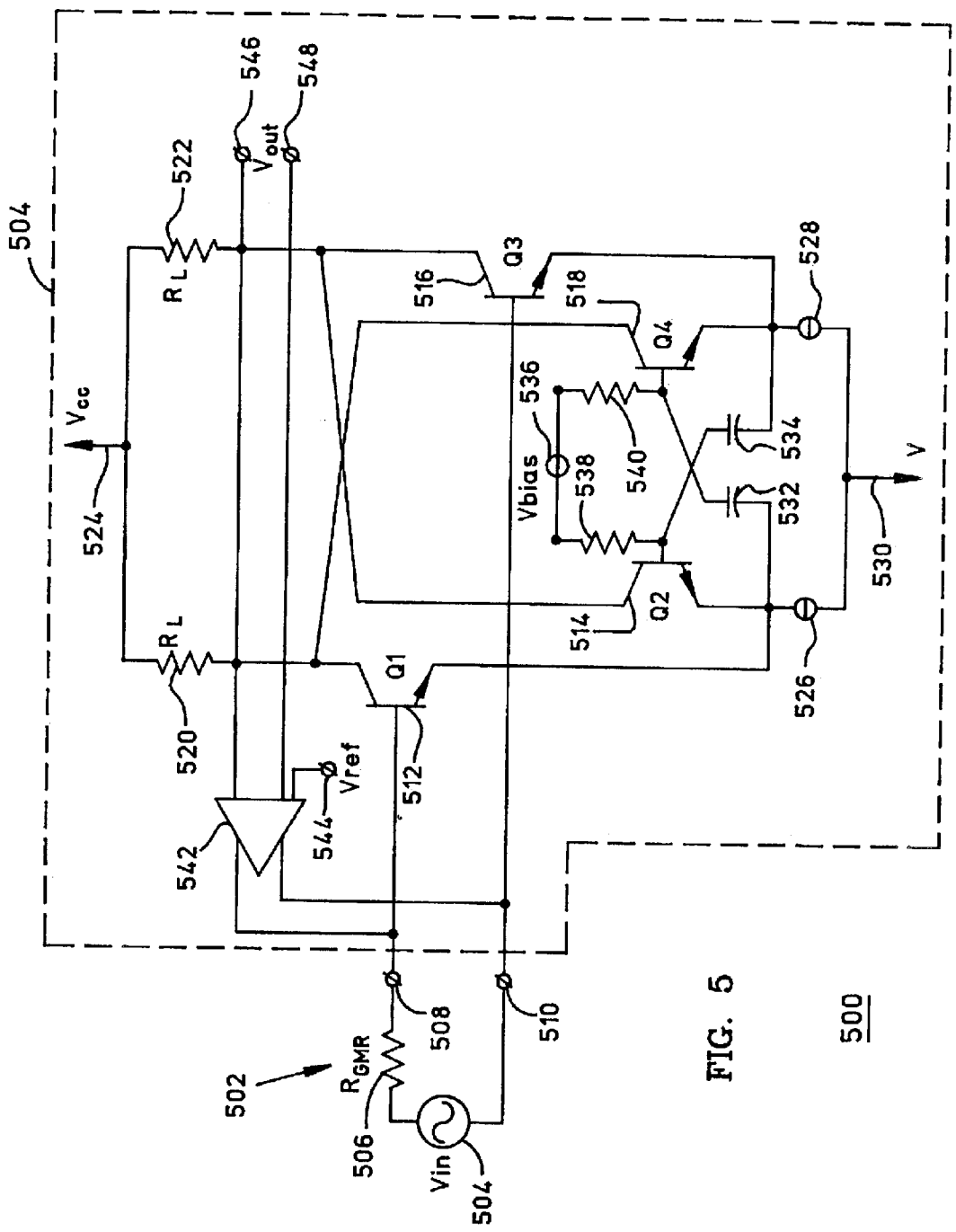
FIG. 5 is a schematic diagram of a preamplifier circuit according to the present invention, which may be employed in the magnetic storage device of FIGS. 3–4.

FIG. 5 is a schematic diagram of circuitry 500 which includes a preamplifier circuit 504 of the present invention, which may be referred to as a Bi-Variant Coupled Pair (BVCP) circuit. Preamplifier circuit 504 is suitable for use in connection with a read sensor 502 of a magnetic storage device, such as magnetic storage device 302 previously described in relation to FIGS. 3–4. Preamplifier circuit 504 is preferably embodied in an integrated circuit (IC), such as IC 312 shown and described in relation to FIGS. 3–4. Read sensor 502 of FIG. 5, which may be a magnetoresistive (MR) or giant magnetoresistive (GMR) read sensor, is schematically represented as a voltage source 506 ($V_{in}$) having an internal resistance 506 ($R_{GMR}$).

Preamplifier circuit 504 generally includes transistors 512, 514, 516, and 518 (denoted in FIG. 5 as Q1 through Q4, respectively); fixed current sources 526 and 528; capacitive elements 532 and 534; resistive elements 520, 522, 538, and 540; and an operational transconductance amplifier (OTA) 542 of the differential-common-mode type (DC-OTA). First and second input nodes 508 and 510 form a differential input of preamplifier circuit 504, to which read sensor 502 may be coupled. First and second output nodes 546 and 548 form a differential output of preamplifier circuit 504, which provides an amplified version of the signal provided at the differential input.

Transistor 512 ("Q1") has a base coupled to first input node 508 of the differential input; a collector coupled to a first voltage source 524 through resistive element 520; and an emitter coupled to a first end of current source 526. Transistor 514 ("Q2") has an emitter coupled to the first end of current source 526 and to a first end of capacitive element 532; a base coupled to a biasing voltage 536 ($V_{Bias}$) through resistive element 538 and to a first end of capacitive element 534; and a collector coupled to first voltage source 524 through resistive element 522. Transistor 516 ("Q3") has a base coupled to second input node 510 of the differential input; a collector coupled to first voltage source 524 through resistive element 522; and an emitter coupled to a first end of current source 528. Transistor 518 ("Q4") has an emitter coupled to the first end of current source 528 and to a second end of capacitive element 534; a base coupled to biasing voltage 536 through resistive element 540 and to a second end of capacitive element 532; and a collector coupled to first voltage source 524 through resistive element 520. Current sources 526 and 528 each have second ends which are coupled to a second voltage source 530. The differential output of preamplifier circuit 504 has its first output node 546 coupled to the collector of transistor 512 and second output node 548 coupled to the collector of transistor 516. OTA 542 has first and second inputs which are coupled to first and the second output nodes 546 and 548, and first and second outputs coupled to first and the second input nodes 508 and 510. The output of OTA 542 is controlled to be centered at a reference voltage 544. If preamplifier circuit 504 is embodied in an IC, external leads are provided on the IC for the differential input as well as for the supply voltages.

Preamplifier circuit 504 may be referred to as a BVCP circuit as it utilizes the double-pair bipolar transistor topology shown in FIG. 5. Transistors 512 and 516 (Q1 & Q3) are the input transistor pair, whereas transistors 514 and 518 (Q2 & Q4) are the DC bias transistor pair for read sensor 502. Fixed current sources 526 and 528, which are typically set to the same current value, are used for biasing all transistors 512, 514, 516, and 518. The fixed DC bias voltage 536 for read sensor 502 ($V_{Bias}$) is applied at the ends of "isolation" resistors 538 and 540 as shown in FIG. 5, but OTA 542 controls the base voltages of transistors 512 and 516 (Q1 & Q3) so that bias voltage 536 is imposed across read sensor 502. OTA 542 also controls the common-mode voltage with respect to reference voltage 544.

In preamplifier circuit 504, the read signals in the midband frequency region are amplified by the transconductance stage of transistors 512, 514, 516, and 518 to generate a current signal. Resistors 520 and 522 translate this current signal into a voltage signal. The mathematical expression for the voltage gain ($G_0$) of preamplifier circuit 504 is $$G_0 = (4/3) R_L / r_e$$

where $G_0$=preamplifier voltage gain, $r_e$=(transistor transconductance)$^{-1}$, and $R_L$=resistor 520 or 522.

The values of the AC coupling capacitors (capacitive elements 532 and 534) can be set to relatively small values as the BVCP circuit uses the cross-coupled connection with transistors 514 and 518 and capacitive elements 532 and 534. These AC coupling capacitors have a noise-canceling effect, and the mathematical expressions for the input referred spot noise sources are $$v^2_{vi}=4kT((5/2)r_b+(5/4)r_e)$$

$$v^2_{vi}=R^2_{GMR}q(I_B+I_C/\beta^2\omega)$$

$$v^2_{RL}=4kT(R_L/G^2_0)$$

where k=Boltzmann's constant, T=temperature (Kelvin), $r_b$=transistor base resistance, q=electron charge constant, $\beta$=transistor current gain, $I_B$=transistor base current, and $I_c$=transistor collector current.

Because of the cross-coupling, transistors 514 and 518 (Q2 & Q4) act cooperatively as if they were a single transistor. If such cross-coupling were not employed, noise contributions associated with emitter resistances $r_e$ from all transistors 512, 514, 516, and 518 (Q1, Q2, Q3, & Q4) contribute to the total noise in preamplifier circuit 504. Since cross-coupling is employed, however, only a single emitter resistance re is associated with both transistors 514 and 518 (Q2 & Q4) for the noise contribution. Unlike the prior art, preamplifier circuit 504 provides for low-noise performance as well as relatively small AC coupling capacitor values to reduce the cost of the IC.

In preamplifier circuit 504 of FIG. 5, any suitable component values and voltages may be utilized as one skilled in the art will readily appreciate. Although a wide range of component values and voltages may be utilized, the following values are deemed suitable for one specific application in a magnetic storage device. In this particular example, read sensor 502 has an internal resistance 506 that varies between about 25–100 ohms and, being biased between about 150–300 millivolts (mV), typically provides a voltage swing between about 0.5 mV (peak-to-peak) and 3 mV (peak-to-peak). First voltage source 524 is about +5 volts (V); second voltage source 530 is about –5 V; fixed current sources 526 and 528 are set between about 1–10 milliamps (mA); and biasing voltage 536 is set between about 150–300 mV. First and second capacitive elements 532 and 534 are capacitors having values between about 50–100 picofarads (pF); first, second, third, and fourth resistive elements 520, 522, 538, and 540 are resistors having values between about 200–800 ohms; and first, second, third, and fourth transistors 512, 514, 516, and 518 are low-noise, bipolar, and NPN-type, and can handle currents up to between about 20–50 mA. Data can be read from the disk at data rates of between about 1.2–1.5 GHz.

Figure 6:
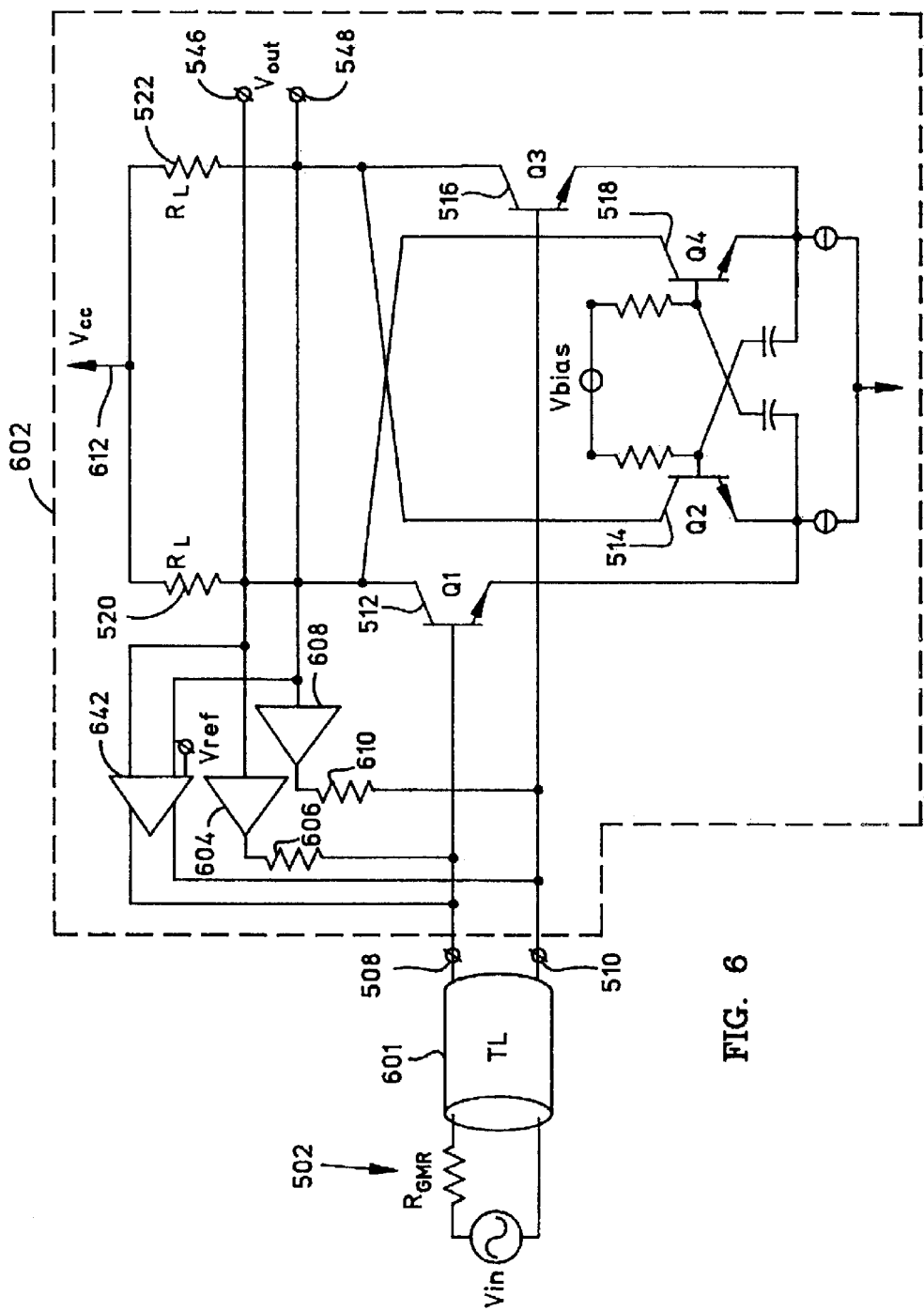
FIG. 6 is a schematic diagram of another preamplifier circuit according to the present invention, which is the same as the circuit in FIG. 5 except that it includes a controllable input impedance of the direct broadband feedback receiver termination (DBT)

FIG. 6 is a schematic diagram of circuitry which includes another preamplifier circuit 602 suitable for use in connection with read sensor 502. Preamplifier circuit 602 has the same components and operates in the same way as preamplifier circuit 502 of FIG. 5, with some additions and modifications which will now be described. Namely, preamplifier circuit 602 has a controllable input impedance. In particular, the controllable input impedance in FIG. 6 is of the direct broadband feedback receiver termination (DBT) type.

The controllable input impedance of the DBT type is used to provide a match in input impedance of preamplifier circuit 602 to the impedance of a transmission line 601. In this particular application, transmission line 601 is suspension interconnect 310 shown and described previously in relation to FIGS. 3–4. The controllable input impedance in FIG. 6 is implemented using buffer circuitry and feedback resistors.

More particularly, a buffer circuit 604 has an input coupled to first output node 546 and an output coupled to first input node 508 through a feedback resistor 606. Similarly, a buffer circuit 608 has an input coupled to second output node 548 and an output coupled to second input node 510 through a feedback resistor 610. Preferably, buffer circuits 604 and 608 are implemented as a conventional emitter-follower pair. A suitable voltage source 612 (Vs) is utilized to properly bias buffer circuits 604 and 608 and transistors 512 and 516 (Q1 & Q3) to eliminate any need for AC coupling capacitors in the feedback signal path. Voltage source 612 may be set to a lower voltage than the supply voltage, for example, 3.5 volts. The buffer circuitry translates the output voltage ($V_{out}$) to feedback resistors 606 and 610; preamplifier circuit 602 is suitable named DBT because of the feedback's direct connection to the output voltage.

The values of feedback resistors 606 and 610 determine the input impedance of preamplifier circuit 602. To achieve an impedance match of 60 ohms (typical impedance of transmission line 601 as the suspension interconnect), for example, the values of feedback resistors 606 and 610 may be between about 1.5K–2.0K ohms. The relationship between the input impedance of preamplifier circuit 602 ($Z_{in}$) and the value of feedback resistors 606 and 610 is $$Z_{in}=3r_n/(1+(3r_n/2R_F)(1+G_0))$$

where $r_n=\beta r_e$. Since $R_{GMR}$ is typically much smaller than feedback resistors 606 and 610, the feedback scheme has no significant impact on the spot noise performance, as apparent from the mathematical expressions below:

$$v^2_{vi}=(1+R_{GMR}/2R_F)^24kT((5/2)r_b+(5/4)r_e),$$

$$v^2_{vi}=(R_{GMR/RF})^24kT(R_F/2), \text{and}$$

$$v^2_{RL}=4kT(R_L/G^2_1).$$

where $R_F$=resistor 606 or 610.

In preamplifier circuit 602, read signals in the mid-band frequency region are amplified by the transconductance stage of transistors 512, 514, 516, and 518 to generate a current signal. Resistors 520 and 522 translate this current signal into a voltage signal. The mathematical expression for the voltage gain ($G_1$) of preamplifier circuit 602, which is affected by the controllable input impedance circuitry, is $$G_1=G_0/((R_{GMR}/R_F)(1+G_0)+(R_{GMR}/3r_n)+1)$$

where $G_1$=voltage gain with controlled input impedance.

Figure 7:
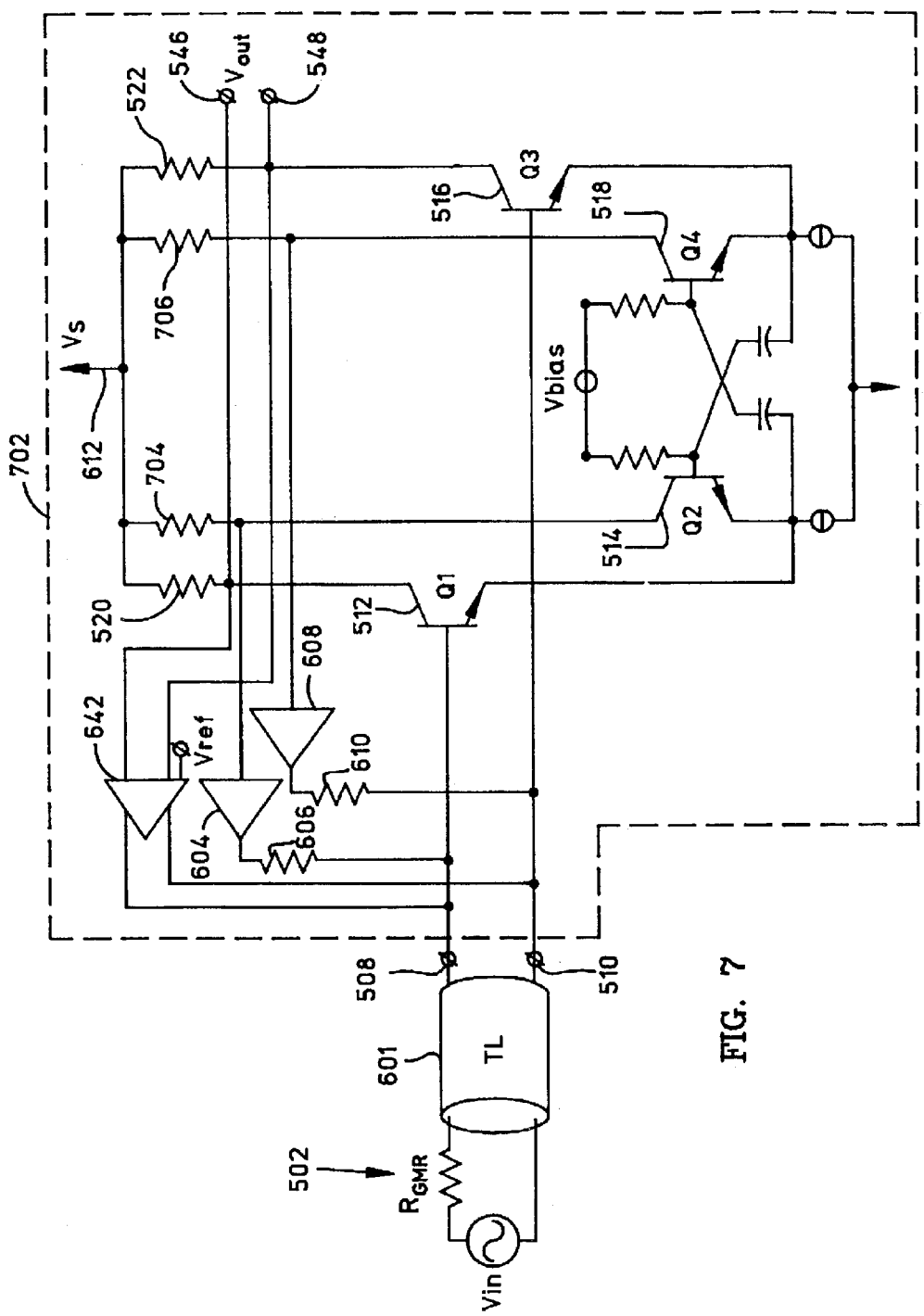
FIG. 7 is a schematic diagram of yet another preamplifier circuit according to the present invention, which is the same as the circuit in FIG. 5 except that it includes a controllable input impedance of the isolated broadband feedback receiver termination (IBT).

FIG. 7 is a schematic diagram of circuitry which includes yet another preamplifier circuit 702 suitable for use in connection with read sensor 502. Preamplifier circuit 702 generally has the same components and operates in the same way as preamplifier circuit 602 of FIG. 6, with some additions and modifications which will now be described. Namely, preamplifier circuit 702 has a controllable input impedance of the isolated broadband feedback termination (IBT) type. As illustrated, buffer circuitry is again used to provide for a match in impedance to the impedance of transmission line 601.

In preamplifier circuit 702, the collector of transistor 514 is coupled to voltage source 612 through a resistive element 704. Similarly, the collector of transistor 518 is coupled to voltage source 612 through a resistive element 706. Buffer circuit 604 has its input coupled to the collector of transistor 514 and voltage source 612 through resistive element 704, and its output coupled to first input node 508 through feedback resistor 606. Similarly, buffer circuit 608 has its input coupled to the collector of transistor 518, and its output coupled to second input node 510 through feedback resistor 610.

The operation of preamplifier circuit 702 is similar to that shown and described n relation to FIG. 6, except that the inputs of the buffer circuits 604 and 608 are sensed across resistive elements 704 and 706. This allows for additional design freedom for matching the desired amplifier specifications by breaking the dependency of first-stage forward-gain and the reverse-gain associated with the feedback which includes the buffers.

Thus, what have been described herein are BVCP circuits suitable for use in channel front-end low-noise preamplifiers of magnetic storage devices. In magnetic storage devices, the channel front-end includes a read transducer, a read/write (R/W) integrated circuit (IC) which includes a BVCP circuit, and a suspension interconnect which connects the read transducer and the R/W IC. The read transducer may be a magnetoresistive (MR) or giant magnetoresistive (GMR) read sensor. In this particular application, the BVCP circuit has the ability to provide (1) a fixed direct current (DC) bias voltage for the varying resistance of the read transducer; (2) low-noise performance; and (3) relatively small alternating current (AC) coupling capacitors for reducing the R/W IC cost. The BVCP circuit may also have a controllable input impedance, which is suitable for matching the impedance of a transmission line (e.g. a suspension interconnect) for high data rate applications. Impedance matching allows the system in which the R/W IC is used to increase or maximize its high frequency bandwidth. Two different controllable input impedance schemes for BVCP circuits are described herein, namely (1) direct broadband feedback receiver termination (DBT) and (2) isolated broadband feedback receiver termination (IBT). In DBT, the BVCP circuit uses the read signal path as a feedback loop, thereby making the preamplifier's input impedance equal to the characteristic impedance of the transmission line. In IBT, the BVCP circuit uses an alternate isolated signal path to control the impedance.

The preamplifier circuit of the present invention includes first, second, third, and fourth transistors; first and second current sources; first and second capacitive elements; and first, second, third, and fourth resistive elements. A differential input of the preamplifier circuit, which includes a first input node and a second input node, may be coupled to a read sensor of a magnetic head. The first transistor has a base coupled to the first input node of the differential input; a collector coupled to a voltage source through the first resistive element; and an emitter coupled to the first current source. The second transistor has a collector coupled to the voltage source through the second resistive element; an emitter coupled to the first current source and to a first end of the first capacitive element; and a base coupled to a biasing voltage through the third resistive element and to a first end of the second capacitive element. The third transistor has a base coupled to the second input node of the differential input; a collector coupled to the voltage source through the second resistive element; and an emitter coupled to the second current source. The fourth transistor has an emitter coupled to the second current source and to a second end of the second capacitive element; a base coupled to the biasing voltage through the fourth resistive element and to a second end of the first capacitive element; and a collector coupled to the voltage source through the first resistive element. A differential output of the preamplifier circuit has a first output node coupled to the collector of the first transistor and a second output node coupled to the collector of the third transistor. The preamplifier circuit may also include an operational transconductance amplifier (OTA), which may be of the differential-common-mode (DC-OTA) type. The OTA has first and second inputs coupled to the first and the second output nodes, and first and second outputs coupled to the first and the second input nodes. To set the preamplifier's input impedance, a first buffer circuit and feedback resistor may be coupled between the first output node and the first input node, and a second buffer circuit and feedback resistor may be coupled between the second output node and the second input node. The input impedance of the preamplifier circuit may be set to match the impedance of a transmission line which is coupled at the differential input.

It is to be understood that the above is merely a description of preferred embodiments of the invention and that various changes, alterations, and variations may be made without departing from the true spirit and scope of the invention as set for in the appended claims. Although the present invention was described above in detail for a magnetic storage device, it may be utilized in any suitable electronic device application having a signal receiving device and requiring low noise and/or wide bandwidth amplification. For example, the BVCP circuit may be used in connection with any amplifier that requires a DC input offset, such as an optical receiver. As another example, the BVCP circuit may be used in connection with test probes for test equipment. Also, although the transistors utilized in the above circuits were shown and described as bipolar NPN type transistors, any suitable transistor type may be utilized as one skilled in the art will readily understand. Furthermore, a single transistor may be implemented as multiple parallel transistors (in an IC design, for example) and the present invention encompasses such variations. None of the terms or phrases in the specification and claims has been given any special particular meaning different from the plain language meaning to those skilled in the art, and therefore the specification is not to be used to define terms in an unduly narrow sense.

What is claimed is:

1. An electronic circuit for amplifying a signal, comprising:
   a differential input which includes a first input node and a second input node for receiving the signal;
   first, second, third, and fourth transistors;
   first and second capacitive elements;
   first and second current sources;
   the first transistor having a base coupled to the first input node of the differential input; a collector for coupling to a voltage source; and an emitter coupled to the first current source;
   the second transistor having an emitter coupled to the first current source and to a first end of the first capacitive element; a base coupled to a biasing voltage and to a first end of the second capacitive element; and a collector for coupling to the voltage source;
   the third transistor having a base coupled to the second input node of the differential input; a collector for coupling to the voltage source; and an emitter coupled to the second current source;
   the fourth transistor having the emitter coupled to the second current source and to a second end of the second capacitive element; a base coupled to the biasing voltage and to a second end of the first capacitive element; and a collector for coupling to the voltage source; and
   a differential output which includes a first output node coupled to the collector of the first transistor and a second output node coupled to the collector of the third transistor.

2. The electronic circuit of claim 1, further comprising:
a first resistor for coupling between the collector of the first transistor and the voltage source; and
a second resistor for coupling between the collector of the third transistor and the voltage source.

3. The electronic circuit of claim 1, further comprising:
a first resistor for coupling between the collector of the first transistor and the voltage source;
the first resistor for coupling between the collector of the fourth transistor and the voltage source;
a second resistor for coupling between the collector of the third transistor and the voltage source; and
the second resistor for coupling between the collector of the second transistor and the voltage source.

4. The electronic circuit of claim 1, further comprising:
a first bias resistor coupled between the base of the second transistor and the biasing voltage; and
a second bias resistor coupled between the base of the fourth transistor and the biasing voltage.

5. The electronic circuit of claim 1, further comprising:
a first bias resistor coupled between the base of the second transistor and the biasing voltage;
a second bias resistor coupled between the base of the fourth transistor and the biasing voltage;
a first resistor for coupling between the collector of the first transistor and the voltage source;
the first resistor for coupling between the collector of the fourth transistor and the voltage source;
a second resistor for coupling between the collector of the third transistor and the voltage source; and
the second resistor for coupling between the collector of the second transistor and the voltage source.

6. The electronic circuit of claim 1, further comprising:
an operational transconductance amplifier which includes:
first and second inputs coupled to the first and the second output nodes of the differential output; and
first and second outputs coupled to the first and the second input nodes of the differential input.

7. The electronic circuit of claim 1, further comprising:
a differential-common-mode operational transconductance amplifier which includes:
first and second inputs coupled to the first and the second output nodes of the differential output; and
first and second outputs coupled to the first and the second input nodes of the differential input.

8. The electronic circuit of claim 1, further comprising:
a first bias resistor coupled between the base of the second transistor and the biasing voltage;
a second bias resistor coupled between the base of the fourth transistor and the biasing voltage;
a first resistor for coupling between the collector of the first transistor and the voltage source;
the first resistor for coupling between the collector of the fourth transistor and the voltage source;
a second resistor for coupling between the collector of the third transistor and the voltage source;
the second resistor for coupling between the collector of the second transistor and the voltage source;
an operational transconductance amplifier which includes:
first and second inputs coupled to the first and the second output nodes of the differential output; and
first and second outputs coupled to the first and the second input nodes of the differential input.

9. The electronic circuit of claim 1, further comprising:
a first buffer circuit and feedback resistor coupled between the collector of the second transistor and one of the first and the second input nodes of the differential input; and
a second buffer circuit and feedback resistor coupled between the collector of the fourth transistor and the other one of the first and the second input nodes of the differential input.

10. The electronic circuit of claim 1, further comprising:
an operational transconductance amplifier which includes:
first and second inputs coupled to the first and the second output nodes of the differential output;
first and second outputs coupled to the first and the second input nodes of the differential input;
a first buffer circuit and feedback resistor coupled between the collector of the second transistor and one of the first and the second input nodes of the differential input; and
a second buffer circuit and feedback resistor coupled between the collector of the fourth transistor and the other one of the first and the second input nodes of the differential input.

11. The electronic circuit of claim 1, further comprising:
a first resistor for coupling between the collector of the first transistor and the voltage source;
a second resistor for coupling between the collector of the third transistor and the voltage source;
a third resistor for coupling between the collector of the second transistor and the voltage source; and
a fourth resistor for coupling between the collector of the fourth transistor and the voltage source.

12. The electronic circuit of claim 1, further comprising:
a first resistor for coupling between the collector of the first transistor and the voltage source;
a second resistor for coupling between the collector of the third transistor and the voltage source;
a third resistor for coupling between the collector of the second transistor and the voltage source;
a fourth resistor for coupling between the collector of the fourth transistor and the voltage source;
an operational transconductance amplifier which includes:
first and second inputs coupled to the first and the second output nodes, respectively;
first and second outputs coupled to the first and the second input nodes, respectively;
a first buffer circuit and feedback resistor coupled between the collector of the second transistor and one of the first input node; and
a second buffer circuit and feedback resistor coupled between the collector of the fourth transistor and the second input node.

13. The electronic circuit of claim 1, wherein the electronic circuit is embodied in an integrated circuit (IC).

14. A magnetic storage device, comprising:
at least one magnetic disk;
a magnetic head which includes a read sensor;
a suspension which supports the magnetic head;
read circuitry which receives signals from the read sensor;

an electrical connection which couples the read sensor to the read circuitry;

the read circuitry including:

a differential input which includes a first input node and a second input node coupled to the electrical connection;

first, second, third, and fourth transistors;

first and second capacitive elements;

first and second fixed current sources;

the first transistor having a base coupled to the first input node of the differential input; a collector for coupling to a voltage source; and an emitter coupled to the first current source;

the second transistor having an emitter coupled to the first current source and to a first end of the first capacitive element; a base coupled to a biasing voltage and to a first end of the second capacitive element; and a collector for coupling to the voltage source;

the third transistor having a base coupled to the second input node of the differential input; a collector for coupling to the voltage source; and an emitter coupled to the second current source;

the fourth transistor having the emitter coupled to the second current source and to a second end of the second capacitive element; a base coupled to the biasing voltage and to a second end of the first capacitive element; and a collector for coupling to the voltage source; and a differential output which includes a first output node coupled to the collector of the first transistor and a second output node coupled to the collector of the third transistor.

15. The magnetic storage device of claim 14, further comprising:

a first resistor for coupling between the collector of the first transistor and the voltage source; and a second resistor for coupling between the collector of the third transistor and the voltage source.

16. The magnetic storage device of claim 14, further comprising:

a first resistor for coupling between the collector of the first transistor and the voltage source;

the first resistor for coupling between the collector of the fourth transistor and the voltage source;

a second resistor for coupling between the collector of the third transistor and the voltage source; and the second resistor for coupling between the collector of the second transistor and the voltage source.

17. The magnetic storage device of claim 14, further comprising:

a first bias resistor coupled between the base of the second transistor and the biasing voltage; and a second bias resistor coupled between the base of the fourth transistor and the biasing voltage.

18. The magnetic storage device of claim 14, further comprising:

a first bias resistor coupled between the base of the second transistor and the biasing voltage;

a second bias resistor coupled between the base of the fourth transistor and the biasing voltage;

a first resistor for coupling between the collector of the first transistor and the voltage source;

the first resistor for coupling between the collector of the fourth transistor and the voltage source;

a second resistor for coupling between the collector of the third transistor and the voltage source; and the second resistor for coupling between the collector of the second transistor and the voltage source.

19. The magnetic storage device of claim 14, further comprising:

an operational transconductance amplifier which includes:

first and second inputs coupled to the first and the second output nodes of the differential output; and first and second outputs coupled to the first and the second input nodes of the differential input.

20. The magnetic storage device of claim 14, further comprising:

a differential-common-mode operational transconductance amplifier which includes:

first and second inputs coupled to the first and the second output nodes of the differential output; and first and second outputs coupled to the first and the second input nodes of the differential input.

21. The magnetic storage device of claim 14, further comprising:

a first bias resistor coupled between the base of the second transistor and the biasing voltage;

a second bias resistor coupled between the base of the fourth transistor and the biasing voltage;

a first resistor for coupling between the collector of the first transistor and the voltage source;

the first resistor for coupling between the collector of the fourth transistor and the voltage source;

a second resistor for coupling between the collector of the third transistor and the voltage source;

the second resistor for coupling between the collector of the second transistor and the voltage source;

an operational transconductance amplifier which includes:

first and second inputs coupled to the first and the second output nodes of the differential output; and first and second outputs coupled to the first and the second input nodes of the differential input.

22. The magnetic storage device of claim 14, further comprising:

a first buffer circuit and feedback resistor coupled between the collector of the second transistor and one of the first and the second input nodes of the differential input; and a second buffer circuit and feedback resistor coupled between the collector of the fourth transistor and the other one of the first and the second input nodes of the differential input.

23. The magnetic storage device of claim 14, further comprising:

an operational transconductance amplifier which includes:

first and second inputs coupled to the first and the second output nodes of the differential output;

first and second outputs coupled to the first and the second input nodes of the differential input;

a first buffer circuit and feedback resistor coupled between the collector of the second transistor and one of the first and the second input nodes of the differential input; and a second buffer circuit and feedback resistor coupled between the collector of the fourth transistor and the other one of the first and the second input nodes of the differential input.

24. The magnetic storage device of claim 14, further comprising:
   a first resistor for coupling between the collector of the first transistor and the voltage source;
   a second resistor for coupling between the collector of the third transistor and the voltage source;
   a third resistor for coupling between the collector of the second transistor and the voltage source; and
   a fourth resistor for coupling between the collector of the fourth transistor and the voltage source.

25. The magnetic storage device of claim 14, further comprising:
   a first resistor for coupling between the collector of the first transistor and the voltage source;
   a second resistor for coupling between the collector of the third transistor and the voltage source;
   a third resistor for coupling between the collector of the second transistor and the voltage source;
   a fourth resistor for coupling between the collector of the fourth transistor and the voltage source;
   an operational transconductance amplifier which includes:
      first and second inputs coupled to the first and the second output nodes, respectively;
      first and second outputs coupled to the first and the second input nodes, respectively;
   a first buffer circuit and feedback resistor coupled between the collector of the second transistor and the first input node of the differential input; and
   a second buffer circuit and feedback resistor coupled between the collector of the fourth transistor and the second input node of the differential input.

26. The magnetic storage device of claim 14, wherein the preamplifier circuit is embodied in an integrated circuit (IC).

27. An integrated circuit (IC), comprising:
   a differential input including a first input node and a second input node;
   first, second, third, and fourth transistors;
   first and second current sources;
   first and second capacitive elements;
   first, second, third, and fourth resistive elements;
   the first transistor having a base coupled to the first input node of the differential input; a collector for coupling to a voltage source through the first resistive element; and an emitter coupled to an emitter of the second transistor;
   the second transistor having an emitter coupled to the first current source and to a first end of the first capacitive element; a base coupled to a biasing voltage through the second resistive element and to a first end of the second capacitive element; and a collector for coupling to the voltage source;
   the third transistor having a base coupled to the second input node of the differential input; a collector for coupling to the voltage source through the third resistive element; and an emitter coupled to an emitter of the fourth transistor;
   the fourth transistor having the emitter coupled to the second current source and to a second end of the second capacitive element; a base coupled to the biasing voltage through the fourth resistive element and to a second end of the first capacitive element; and a collector for coupling to the voltage source;
   a differential output which includes a first output node coupled to the collector of the first transistor and a second output node coupled to the collector of the third transistor; and
   an operational transconductance amplifier having first and second inputs coupled to the first and the second output nodes, and first and second outputs coupled to the first and the second input nodes.

28. The IC of claim 27, wherein the IC comprises a read/write IC for a magnetic storage device.

29. The IC of claim 27, wherein the differential input is suitable for coupling to a read sensor through a suspension interconnect of a magnetic storage device.

30. The IC of claim 27, further comprising:
   first and second supply voltage inputs for receiving the voltage source.

31. The IC of claim 27, further comprising:
   a first buffer circuit and feedback resistor coupled between the first output node and the first input node; and
   a second buffer circuit and feedback resistor coupled between the second output node and the second input node.

32. The IC of claim 27, further comprising:
   a first buffer circuit and feedback resistor coupled between the first output node and the first input node;
   a second buffer circuit and feedback resistor coupled between the second output node and the second input node; and
   wherein the feedback resistors have values such that an input impedance at the differential input matches an impedance of a transmission line coupled to the differential input.

33. The IC of claim 27, further comprising:
   wherein the collector of the second transistor is for coupling to the voltage source through the second resistive element; and
   wherein the collector of the fourth transistor is for coupling to the voltage source through the first resistive element.

34. The IC of claim 27, further comprising:
   wherein the collector of the second transistor is for coupling to the voltage source through a fifth resistive element; and
   wherein the collector of the fourth transistor is for coupling to the voltage source through a sixth resistive element.

35. The IC of claim 27, further comprising:
   wherein the collector of the second transistor is for coupling to the voltage source through a fifth resistive element;
   wherein the collector of the fourth transistor is for coupling to the voltage source through a sixth resistive element;
   a first buffer circuit and feedback resistor coupled between the collector of the second transistor and the first input node; and
   a second buffer circuit and feedback resistor coupled between the collector of the fourth transistor and the second input node.

36. An electronic device, comprising:
   a signal receiving device;

an integrated circuit (IC);

an electrical connection for coupling the signal receiving device to the IC;

an electronic circuit in the IC including:
- a differential input including a first input node and a second input node for coupling to the electrical connection;
- first, second, third, and fourth transistors;
- first and second fixed current sources;
- first and second capacitive elements;
- first, second, third, and fourth resistive elements;
- the first transistor having a base coupled to the first input node of the differential input; a collector for coupling to a voltage source through the first resistive element; and an emitter coupled to the first current source;
- the second transistor having an emitter coupled to the first current source and to a first end of the first capacitive element; a base coupled to a biasing voltage through the third resistive element and to a first end of the second capacitive element; and a collector for coupling to the voltage source;
- the third transistor having a base coupled to the second input node of the differential input; a collector for coupling to the voltage source through the second resistive element; and an emitter coupled to the second current source;
- the fourth transistor having the emitter coupled to the second current source and to a second end of the second capacitive element; a base coupled to the biasing voltage through the fourth resistive element and to a second end of the first capacitive element; and a collector for coupling to the voltage source;
- a differential output which includes a first output node coupled to the collector of the first transistor and a second output node coupled to the collector of the third transistor;
- an operational transconductance amplifier which has:
  - first and second inputs coupled to the first and the second output nodes of the differential output;
  - first and second outputs coupled to the first and the second input nodes of the differential input;
- a first buffer circuit having an input coupled to the collector of the second transistor and an output coupled to one of the first and the second input nodes through a first feedback resistor; and
- a second buffer circuit having an input coupled to the collector of the fourth transistor and an output coupled to the other one of the first and the second input nodes through a second feedback resistor.

37. The electronic device of claim 36, wherein the electronic device comprises a magnetic storage device and the signal receiving device comprises a read sensor.

38. The electronic device of claim 36, wherein the first and the second feedback resistors having values such that an input impedance of the electronic circuit matches an impedance of the electrical connection coupled to the differential input.

* * * * *

UNITED STATES PATENT AND TRADEMARK OFFICE
CERTIFICATE OF CORRECTION

PATENT NO. : 6,822,817 B2
DATED : November 23, 2004
INVENTOR(S) : Chung et al.

It is certified that error appears in the above-identified patent and that said Letters Patent is hereby corrected as shown below:

Column 8,
Line 46, that portion of the Equation reading
"$(R_{GMR}/3r_n)$" should read -- $(R_{GMR}/3r_\pi)$ --

Signed and Sealed this

Seventeenth Day of May, 2005

JON W. DUDAS
*Director of the United States Patent and Trademark Office*